United States Patent [19]

Nakano et al.

[11] Patent Number: 5,225,311
[45] Date of Patent: Jul. 6, 1993

[54] POSITIVE PHOTORESIST COMPOSITION

[75] Inventors: Toshitomo Nakano; Masumi Kada, both of Mie, Japan

[73] Assignee: Mitsubishi Petrochemical Co., Ltd., Tokyo, Japan

[21] Appl. No.: 681,058

[22] Filed: Apr. 5, 1991

[30] Foreign Application Priority Data

Apr. 13, 1990 [JP] Japan ................................. 2-98084

[51] Int. Cl.⁵ .......................... G03F 7/023; G03F 7/32
[52] U.S. Cl. ..................................... 430/190; 430/165; 430/191; 430/192; 430/193; 430/326; 430/330
[58] Field of Search ............... 430/192, 193, 165, 166, 430/326, 330

[56] References Cited

U.S. PATENT DOCUMENTS

| | | | |
|---|---|---|---|
| 4,499,171 | 2/1985 | Hosaka et al. | 430/193 |
| 4,551,409 | 11/1985 | Gulla et al. | 430/165 |
| 4,650,741 | 3/1987 | Miura et al. | 430/192 |
| 4,812,551 | 3/1989 | Oi et al. | 430/165 |
| 4,863,828 | 9/1989 | Kawabe et al. | 430/193 |
| 4,871,645 | 10/1989 | Uenishi et al. | 430/193 |
| 4,920,028 | 5/1990 | Lazarus et al. | 430/166 |
| 4,959,292 | 9/1990 | Blakeney et al. | 430/165 |
| 5,023,311 | 6/1991 | Kubota | 430/165 |

FOREIGN PATENT DOCUMENTS

| | | |
|---|---|---|
| 227487 | 7/1987 | European Pat. Off. . |
| 336604 | 10/1989 | European Pat. Off. . |
| 3839714 | 6/1989 | Fed. Rep. of Germany . |
| 1227602 | 4/1971 | United Kingdom . |

Primary Examiner—Charles L. Bowers, Jr.
Assistant Examiner—John S. Chu
Attorney, Agent, or Firm—Oblon, Spivak, McClelland, Maier & Neustadt

[57] ABSTRACT

A positive photoresist composition is disclosed, comprising (a) from 50 to 99 parts by weight of a polyhydric phenol compound which is a condensation product between a mixed phenol comprising o-cresol and at least one of 2,5-dimethylphenol and 3,5-dimethylphenol at a molar ratio of from 95/5 to 5/95 and an aldehyde and (b) from 1 to 50 parts by weight of a quinone diazide compound. The composition is excellent in sensitivity, resolving power, heat resistance, and resistance to dry etching.

9 Claims, No Drawings

POSITIVE PHOTORESIST COMPOSITION

FIELD OF THE INVENTION

This invention relates to a positively working photoresist composition which is suitable for production of integrated circuits and printed circuits and image formation by photoetching.

BACKGROUND OF THE INVENTION

In production of semi-conductor integrated circuits, magnetic bubble memory elements, etc., photoetching or lithography using energy rays, such as light (visible rays, ultraviolet rays, far ultraviolet rays), electron beams, ion beams, and X-rays is used. Resists used as a protecting film against etching in lithography include a negatively working type and a positively working type, and the use of positive resists has recently been extending because they favor formation of finer patterns as compared with negative ones. Positive photoresists generally comprise a combination of a cresol novolak resin and a quinone diazide compound, which is insoluble in alkalis but is rendered alkali-solubilized on exposure to light.

There is a strong and increasing demand for resists for the formation of integrated circuits to have improved performance properties such as sensitivity, resolving power, heat resistance, and resistance to dry etching, with the tendency to high level of integration. In order to meet the demand, alkali-soluble novolak resins prepared from various phenol compounds have been proposed. For example, JP-A-60-176034 and JP-A-61-275748 (the term "JP-A" as used herein means an "unexamined published Japanese patent application") teach to use a novolak resin prepared by condensation of m-cresol and xylenol with formaldehyde.

To increase resolving power, a resin is required to have a narrow molecular weight distribution and a low degree of dispersion so as to be sharply dissolved with a developer. To improve heat resistance and resistance to dry etching, it is effective to increase a molecular weight of the resin.

However, novolak resins mainly comprising m-cresol which have been made frequent use of as a resist base are apt to have a broad molecular weight distribution and a high degree of dispersion due to very high reactivity of m-cresol. Moreover, they have a limit of molecular weight because an increase in molecular weight in an attempt to improve heat resistance tends to be accompanied by gelation. Copolymers of m-cresol and xylenol have the same problems. Thus, sufficient improvements on resolving power, heat resistance and resistance to dry etching have not yet been reached.

SUMMARY OF THE INVENTION

An object of the present invention is to provide a positive photoresist composition excellent in sensitivity, resolving power, heat resistance, and resistance to dry etching which is suited for formation of a fine pattern as demanded in production of printed circuits and, in particular, integrated circuits including LSI.

The present invention relates to a positive photoresist composition comprising (a) from 50 to 99 parts by weight of a polyhydric phenol compound which is a condensation product between a mixed phenol comprising o-cresol and at least one of 2,5-dimethylphenol and 3,5-dimethylphenol at a molar ratio of from 95/5 to 5/95 and an aldehyde and (b) from 1 to 50 parts by weight of a quinone diazide compound.

DETAILED DESCRIPTION OF THE INVENTION

The polyhydric phenol compound as component (a) can be prepared, for example, as follows.

Phenols which can be used as starting materials are mixtures of o-cresol and at least one of 2,5-dimethylphenol and 3,5-dimethylphenol (hereinafter inclusively referred to dimethylphenol(s)). A mixing molar ratio of o-cresol to dimethylphenol ranges from 95/5 to 5/95, and preferably from 90/10 to 10/90.

Dimethylphenols with a methyl group at the m-position (5position) have high resolving power and, in addition, those having no substituent on the position adjacent to the m-position (5-position) are preferred. This is the reason why 2,5- and 3,5-dimethylphenols are used in the present invention. Where 2,5- and 3,5-dimethylphenols are used in combination, the mixing ratio is arbitrary.

Use of o-cresol as a starting material brings about not only higher solubility in a developer which leads to increased sensitivity but narrower molecular weight distribution which leads to improved resolving power than in use of m-cresol.

While it has been accepted that novolak resins of o-cresol have excessive solubility in a developer as compared with those of m-cresol and are thus unsuitable as a photoresist, it appears that a combined use with the above-described dimethylphenol(s) specifically improves performance properties.

Aldehydes which can be used in the present invention include formaldehyde, alkylaldehydes (e.g., acetaldehyde and propionaldehyde), an arylaldehyde (e.g., benzaldehyde), and a hydroxy aromatic aldehyde (e.g., salicylaldehyde, 4-hydroxybenzaldehyde, and -3-bromo-4-hydroxybenzaldehyde). Hydroxy aromatic aldehydes are particularly preferred since the resulting photoresist compositions have high sensitivity.

The mixed phenol and aldehyde are subjected to polycondensation using an acid as a catalyst in a manner as described, for example, in Chemistry and Application of Phenolic Resins by Springer-Verlag, Berlin Heidelberg (1979). Acids to be used may be either inorganic acids or organic acids and include, for example, hydrochloric acid, sulfuric acid, phosphoric acid, and p-toluenesulfonic acid. Organic acid salts of divalent metals may also be used as a catalyst for polycondensation. Examples of suitable divalent metals are calcium, magnesium, manganese, zinc, cadmium, cobalt, and lead.

While not limiting, the polyhydric phenol compound as component (a) has a number average molecular weight of from about 300 to 20,000 as measured by gel-permeation chromatography (GPC). Those having a number average molecular weight exceeding 1,500 are particularly preferred for obtaining improved heat resistance and improved resistance to dry etching.

Such a high-molecular weight polyhydric phenol compound, which has hitherto been considered difficult to obtain, can be prepared by a process described below.

An aldehyde, especially formaldehyde, paraformaldehyde or trioxan is added to a mixed phenol comprising o-cresol and dimethylphenol(s), and polymerization is conducted in the presence of an acidic catalyst in a solvent selected from an alkyl alcohol having from 3 to 12 carbon atoms, benzyl alcohol, a glycol ether or diethylene glycol ether of an alcohol having from 3 to 12 carbon atoms, and an alkylcarboxylic acid having from 1 to 6 carbon atoms.

Quinone diazide compounds which can be used in the present invention as component (b) include condensation products formed between a low-molecular weight or high-molecular weight compound containing a naphthoquinonediazide group or a benzoquinonediazide group, such as naphthoquinonediazidesulfonic acid chloride and benzoquinonediazidesulfonic acid chloride, and a low-molecular weight or high-molecular weight compound containing a hydroxyl group. Examples of low-molecular weight compounds having a hydroxyl group are hydroquinone, resorcin, phloroglucin, 2,4-dihydroxybenzophenone, 2,3,4-trihydroxybenzophenone, gallic acid alkyl esters, and 2,2',4,4'-tetrahydroxybenzophenone. Examples of high-molecular weight compounds having a hydroxyl group are phenolic resins and polyhydrostyrene.

The above-described polyhydric phenol compounds may be used as a hydroxyl-containing compound to be condensed with naphthoquinonediazidesulfonic acid chloride or benzoquinonediazidesulfonic acid. This being the case, the ratio of two components of the reaction is that the quinonediazidesulfonic acid residue is in an amount of from 1 to 100 parts by weight per 100 parts by weight of the polyhydric phenol compound. The condensation product is a mixture consisting of an unreacted polyhydric phenol compound and a quinone diazide compound to which a polyhydric phenol compound has been chemically bonded and can be used as it is as the positive photoresist composition of the present invention.

The weight ratio of the polyhydric phenol compound to the quinone diazide compound ((a)/(b)) ranges from 50 to 99/50 to 1, and preferably from 60 to 90/40 to 10.

If desired, the positive photoresist composition of the present invention may further contain small proportions of resins, surface active agents, preservation stabilizers, dyes, and pigments.

The positive photoresist composition according to the present invention can be prepared by dissolving the above-described components (a) and (b) and other optional additives in a solvent. Examples of suitable solvents include glycol ethers, e.g., ethylene glycol monomethyl ether, ethylene glycol monoethyl ether, and diethylene glycol monomethyl ether; glycol ether esters, e.g., ethylene glycol monomethyl ether acetate and ethylene glycol monoethyl acetate; aromatic hydrocarbons, e.g., toluene, and xylene; ketones, e.g., methyl ethyl ketone, cyclohexanone, and isophorone; esters, e.g., ethyl acetate, butyl acetate, benzyl acetate, and ethylene carbonate; ethers, e.g., benzyl ethyl ether, dioxane, and diethylene glycol dimethyl ether; and alcohols, e.g., octanol and benzyl alcohol.

A developer with which the positive photoresist composition of the present invention can be dissolved includes inorganic alkalis, e.g., sodium carbonate, sodium hydroxide, and sodium phosphate; and organic alkalis, e.g., propylamine, piperidine, triethanolamine, tetramethylammonium hydroxide, and choline.

As previously explained, conventional positive photoresist compositions have used, as an alkali-soluble polyhydric phenol, copolymers mainly comprising m-cresol, i.e., m-cresol/p-cresol copolymers and m-cresol/xylenol copolymers. The photoresist composition of the present invention, on the other hand, uses a copolymer of o-cresol and 3,5-dimethylphenol and/or 2,5-dimethylphenol and thereby achieves improvements in all of sensitivity, resolving power, heat resistance, and resistance to dry etching. As a result, the photoresist of the present invention precisely forms a pattern for integrated circuits, etc. having a fineness of 1 μm or less and, in addition, exhibits excellent processing properties in the subsequent steps such as etching.

Thus, the present invention provides a positive photoresist composition which is extremely beneficial in the field of semiconductors having a steadily increasing demand for high degree of integration.

The present invention is now illustrated in greater detail with reference to the following Examples, but it should be understood that the present invention is not deemed to be limited thereto. All the parts, percents and ratios are by weight unless otherwise specified.

SYNTHESIS EXAMPLE 1

In a flask equipped with a reflux condenser, a stirrer, and a thermometer were charged 64.8 g of o-cresol and 48.9 g of 2,5-dimethylphenol, and 92 ml of a 37% formaldehyde aqueous solution and 0.5 g of oxalic acid were added thereto. The mixture was heated to 100° C. with stirring to conduct condensation for 5 hours. After the reaction, the temperature was raised from 100° C. to finally 180° C. to distill off water and any unreacted matter, and the pressure was reduced to 10 mmHg to remove volatile contents. The residual molten resin was taken out and cooled to obtain 114 g of a resin (designated polyhydric phenol A). The resulting resin had a number average molecular weight (Mn) of 1,250 and a weight average molecular weight (Mw) of 3,500 as determined by GPC (hereinafter the same) and a softening point of 125° C. as determined by a ring and ball method (hereinafter the same).

SYNTHESIS EXAMPLE 2

The same procedures of Synthesis Example 1 were repeated, except for replacing 2,5-dimethylphenol with 48.9 g of 3,5dimethylphenol, to obtain 116 g of a resin (designated polyhydric phenol B). The resulting resin had an Mn of 1,150, an Mw of 3,350, and a softening point of 128° C.

SYNTHESIS EXAMPLE 3

In a flask equipped with a reflux condenser, a stirrer, a thermometer, and a dropping funnel were charged 64.8 g of o-cresol, 48.9 g of 2,5-dimethylphenol, and 30 g of trioxan, 0 g of ethylene glycol monomethyl ether was added thereto. The mixture was heated to 100° C., and 10 g of concentrated sulfuric acid was slowly added dropwise thereto, followed by allowing the mixture to react at 110° C. for 6 hours. After completion of the reaction, the reaction mixture was poured into 3.5 l of water containing 38 g of sodium hydrogencarbonate while stirring at a high speed. The precipitated fine powder was collected by filtration, washed with water to remove ionic impurities, and dried under reduced pressure to obtain 104 g of a resin (designated polyhydric phenol C). The resulting resin had an Mn of 3,100, an Mw of 8,100, and a softening point of 8° C.

SYNTHESIS EXAMPLE 4

The same procedures of Synthesis Example 3 were repeated, except for replacing 2,5-dimethylphenol with 48.9 g of 3,5dimethylphenol, to obtain 101 g of a resin (designated polyhydric phenol D). The resulting resin had an Mn of 3,400, an Mw of 8,500, and a softening point of 195° C.

SYNTHESIS EXAMPLE 5

In a flask equipped with a reflux condenser, a stirrer, and a thermometer were charged 54 g of m-cresol and 61 g of 2,5dimethylphenol. To the mixture were added 67.7 ml of a 37% aqueous formaldehyde solution, 1.02 g of oxalic acid, 107.5 g of deionized water, and 100 g of ethylene glycol monoethyl ether acetate, followed by heating to 100° C. with stirring to conduct condensation for 15 hours. After the reaction, the reaction mixture was neutralized and washed with water. The temperature was raised to 180° C. to distill off water and any unreacted matter, and finally the pressure was reduced to 10 mmHg to remove volatile contents. The residual molten resin was taken out and cooled to obtain 111 g of a resin (designated polyhydric phenol F). The resulting resin had an Mn of 1,100, and Mw of 6,200, and a softening point of 132° C.

SYNTHESIS EXAMPLE 6

The same procedures of Synthesis Example 5 were repeated, except for replacing 2,5-dimethylphenol with 61 g of 3,5dimethylphenol, to obtain 114 g of a resin (designated polyhydric phenol E). The resulting resin had an Mn of 1,150, an Mw of 6,500, and a softening point of 135° C.

EXAMPLE 1

Naphthoquinone-(1,2)-diazido-(2)-sulfonicacidchlorideand 2,3,4-trihydroxybenzophenone were condensed at a molar ratio of 1.2/1 to prepare a photosensitive agent A.

In 23.3 g of an 8/2 mixed solvent of ethylene glycol monoethyl ether and n-butyl acetate were dissolved 8.1 g of polyhydric phenol A and 1.9 g of photosensitive agent A, and the solution was filtered through a membrane filter having a pore size of 0.2 μm to prepare a solution of a positive photoresist composition.

The resulting solution was coated on a silicon wafer having a silicon oxide film by means of a spinner and pre-baked in an oven at 90° C. for 30 minutes to form a 1 μm thick resist film.

The resist film was exposed to ultraviolet light emitted from a ultra-high-pressure mercury lamp (250 W) through a photomask and then developed with a developer (a 2% aqueous solution of tetramethylammonium hydroxide) at 20° C. for 60 seconds, rinsed, and dried. Characteristics of the thus formed resist pattern are shown in Table 1 below.

EXAMPLES 2 TO 4

A resist pattern was formed in the same manner as in Example 1, except for replacing polyhydric phenol A with polyhydric phenol B, C or D and changing the amount of the solvent so as to form a resist film having a dry thickness of 1 μm. Characteristics of the resulting resist pattern are shown in Table 1.

EXAMPLE 5

In a flask equipped with a stirrer, a thermometer, and a dropping funnel was charged 12.6 g of polyhydric phenol C, and 50 g of dioxane was added thereto to form a solution. A solution of 3.6 g of sodium hydroxide in 15 g of water was put in the dropping funnel. In a separate flask, 4.8 g of naphthoquinone-(1,2)-diazido-(2)-5-sulfonic acid chloride was dissolved in 40 g of dioxane to form a solution.

The solution of polyhydric phenol C was cooled with ice while stirring, and the naphthoquinonediazidosulfonic acid chloride solution was added thereto. Further, the sodium hydroxide aqueous solution was slowly added thereto from the dropping funnel to conduct reaction. After completion of the reaction, the reaction mixture was poured into 3 l of diluted hydrochloric acid with stirring at a high speed, and the precipitated fine powder was collected by filtration. The resin powder was washed with water to remove ionic impurities and dried under reduced pressure to obtain 12.5 g of a resin (designated polyhydric phenol G). The resulting resin had an Mn of 3,150 and an Mw of 8,250. An IR spectrum of the resin showed an absorption assigned to quinonediazide at 2100 cm.

Ten grams of the resulting resin was dissolved in 30 g of an 8/2 mixed solvent of ethylene glycol monoethyl ether and n-butyl acetate, and the solution was filtered through a membrane filter having a pore size of 0.2 μm to prepare a solution of a positive photoresist composition.

The solution was coated on a silicon wafer having a silicon oxide film by means of a spinner and pre-baked in an oven at 90° C. for 30 minutes to form a 1 μm thick resist film.

The resist film was exposed to ultraviolet light emitted from a 250 W ultra-high-pressure mercury lamp through a photomask and then developed with a developer (a 2% aqueous solution of tetramethylammonium hydroxide) at 20° C. for 60 seconds, rinsed, and dried. Characteristics of the thus formed resist pattern are shown in Table 1.

COMPARATIVE EXAMPLES 1 AND 2

A resist pattern was formed in the same manner as in Example 1, except for replacing polyhydric phenol A with polyhydric phenol E or F and changing the amount of the solvent so as to form a resist film having a dry thickness of 1 μm. Characteristics of the thus formed resist pattern are shown in Table 1.

Characteristics of the resist films formed were determined as follows.

1) Sensitivity

Expressed in terms of an energy necessary for obtaining a given image.

2) Resolving Power

Expressed in terms of a width of the finest line pattern formed.

3) Film Retention

Retention (%) of a resist film on an unexposed area after development was obtained from equation: (film thickness after development/film thickness before development)×100.

4) Resistance to Dry Etching

A silicon wafer having thereon a developed resist pattern was mounted on a parallel plate type plasma etching machine and dry etched with a plasm of carbon tetrafluoride/oxygen (95/5 by volume) generated under conditions of an output of 100 W and a gas pressure of 15 Pa. A ratio of a rate of etching of the silicon oxide film to that of the resist pattern was obtained to determine selectivity of dry etching, i.e., resistance of the resist pattern against dry etching.

5) Heat Resistance

A temperature at which a resist pattern began to deform by heating was measured.

TABLE 1

| Example No. | Sensitivity (mJ/cm$^2$) | Finest Pattern Width (μm) | Film Retention (%) | Resistance to Dry Etching | Heat Resistance (°C.) |
| --- | --- | --- | --- | --- | --- |
| Example 1 | 8.5 | 0.6 | 98 | 3.7 | 170 |
| Example 2 | 8.4 | 0.7 | 98 | 3.6 | 170 |
| Example 3 | 8.8 | 0.6 | 99 | 3.8 | >200 |
| Example 4 | 8.7 | 0.7 | 99 | 3.7 | >200 |
| Example 5 | 8.5 | 0.6 | 99 | 3.8 | >200 |
| Comparative Example 1 | 10.2 | 1.1 | 94 | 3.0 | 165 |
| Comparative Example 2 | 10.4 | 1.1 | 94 | 3.1 | 165 |

While the invention has been described in detail and with reference to specific examples thereof, it will be apparent to one skilled in the art that various changes and modifications can be made therein without departing from the spirit and scope thereof.

What is claimed is:

1. A positive photoresist composition comprising (a) from 50 to 99 parts by weight of a polyhydric phenol resin which is a condensation product between a mixed phenol comprising o-cresol and at least one of 2,5-dimethylphenol and 3,5-dimethylphenol at a molar ratio of from 95/5 to 5/95 and an aldehyde and (b) from 1 to 50 parts by weight of a quinone diazide compound.

2. A positive photoresist composition as claimed in claim 1, wherein said polyhydric phenol compound has a number average molecular weight exceeding 1,500.

3. A positive photoresist composition as claimed in claim 1, wherein said aldehyde is formaldehyde.

4. A positive photoresist composition as claimed in claim 2, wherein said aldehyde is formaldehyde.

5. A positive photoresist composition as claimed in claim 1, wherein said aldehyde is a hydroxy aromatic aldehyde.

6. A positive photoresist composition as claimed in claim 2, wherein said aldehyde is a hydroxy aromatic aldehyde.

7. A positive photoresist composition as claimed in claim 1, wherein the polyhydric phenol resin and the quinone diazide compound are chemically bonded to each other.

8. The photoresist composition of claim 1, wherein the mixed phenol consists essentially of o-cresol and at least one of 2,5- dimethylphenol and 3,5-dimethylphenol.

9. The photoresist composition of claim 8, wherein the molar ratio of o-cresol to at least one of 2,5- dimethylphenol and 3,5-dimethylphenol is 90/10 to 10/90.

* * * * *

UNITED STATES PATENT AND TRADEMARK OFFICE
CERTIFICATE OF CORRECTION

PATENT NO. : 5,225,311
DATED : July 6, 1993
INVENTOR(S) : Yoshitomo Nakano et al.

It is certified that error appears in the above-indentified patent and that said Letters Patent is hereby corrected as shown below:

On the title page, Item [75],

The first inventor's first name is spelled incorrectly, should read:

--Yoshitomo--

Signed and Sealed this

Eighth Day of February, 1994

*Attest:*

BRUCE LEHMAN

*Attesting Officer*    *Commissioner of Patents and Trademarks*